(12) United States Patent
Lee et al.

(10) Patent No.: US 6,734,388 B2
(45) Date of Patent: May 11, 2004

(54) DRY SURFACE CLEANING APPARATUS

(75) Inventors: Jong-Myong Lee, Yongin-si (KR);
Sung Ho Cho, Yongin-si (KR)

(73) Assignee: IMT Co., Ltd., Yongin-si (KR)

( * ) Notice: Subject to any disclaimer, the term of this patent is extended or adjusted under 35 U.S.C. 154(b) by 20 days.

(21) Appl. No.: 10/136,529

(22) Filed: May 2, 2002

(65) Prior Publication Data

US 2003/0106881 A1 Jun. 12, 2003

(30) Foreign Application Priority Data

Dec. 7, 2001 (KR) .......................................... 2001-77320

(51) Int. Cl.[7] ............................................... B23K 26/00
(52) U.S. Cl. ............................... 219/121.68; 219/121.67
(58) Field of Search ........................ 219/121.68, 121.67, 219/121.69, 121.84

(56) References Cited

U.S. PATENT DOCUMENTS

| | | | | |
|---|---|---|---|---|
| 5,531,857 A | * | 7/1996 | Engelsberg et al. | 156/345.5 |
| 5,614,339 A | * | 3/1997 | Tankovich | 430/19 |
| 6,178,973 B1 | * | 1/2001 | Franca et al. | 134/1.3 |
| 6,407,385 B1 | * | 6/2002 | Okada | 250/306 |
| 2003/0032297 A1 | * | 2/2003 | Lindstrom et al. | 438/706 |

* cited by examiner

Primary Examiner—M. Alexandra Elve
(74) Attorney, Agent, or Firm—Jacobson Holman PLLC

(57) ABSTRACT

A dry surface cleaning apparatus removes surface contaminants on a surface of a workpiece. The dry surface cleaning apparatus has a laser for generating a laser beam, a sealed chamber for holding the workpiece therein, wherein the sealed chamber has a transparent window through which the laser beam is transmitted, and a laser focusing lens for converging the laser beam on a laser focus around the surface of the workpiece to generate a plasma shock wave around the laser focus.

10 Claims, 3 Drawing Sheets

DRY SURFACE CLEANING APPARATUS

FIELD OF THE INVENTION

The present invention relates to a dry surface cleaning apparatus; and, more particularly, to a dry surface cleaning apparatus for generating a laser induced plasma shock wave in a sealed chamber to efficiently remove a plurality of surface contaminants on a workpiece.

BACKGROUND OF THE INVENTION

Surface contaminants such as micron and submicron sized particles on semiconductor surfaces can pose serious problems such as circuit failure and yield loss in a semiconductor device. For example, particles smaller than 0.06 micrometer can cause fatal device defects for a next generation dynamic random access memory and a microprocessor. The contamination control on a silicon wafer is therefore a crucial issue in the manufacturing thereof. More effective techniques to remove smaller and smaller particles from the surface are required as the density of a chip device keeps increasing. However, those small particles are more difficult to remove due to their strong adhesion force on the surface. Conventional cleaning techniques such as high pressure gas jet, scrubbing, ultrasonic and chemical flux are known to be ineffective in removing the small particles of micron or submicron dimensions and further, there is possibility for them to inflict a mechanical action-based damage in the surface profile as well as an environmental pollution problem due to the considerable water consumption and the use of chemicals.

SUMMARY OF THE INVENTION

It is, therefore, an object of the present invention to provide a dry surface cleaning apparatus for converging a laser beam on a laser focus located in a sealed chamber to generate a plasma shock wave around the laser focus in the sealed chamber so that the plasma shock wave may be used to remove a plurality of surface contaminants on a workpiece in the sealed chamber.

In accordance with a preferred embodiment of the present invention, there is provided a dry surface cleaning apparatus for removing surface contaminants on a surface of a workpiece comprising:

a laser for generating a laser beam;

a sealed chamber for holding the workpiece therein, wherein the sealed chamber has a transparent window through which the laser beam is transmitted;

a reflection mirror for introducing the laser beam to the transparent window; and a laser focusing lens for converging the laser beam on a laser focus around the surface of the workpiece to generate a plasma shock wave around the laser focus, wherein the plasma shock wave is used to detach the surface contaminants on the surface.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
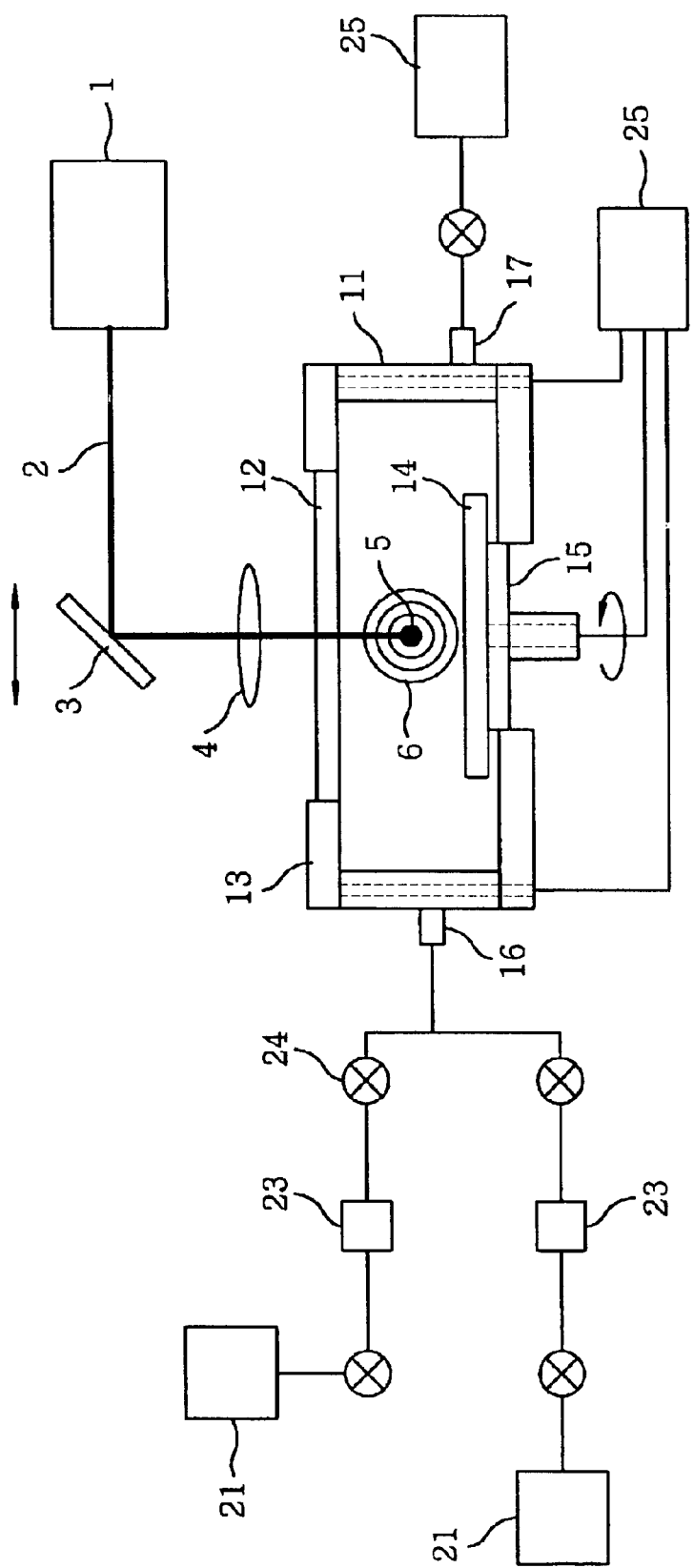
FIG. 1 represents a schematic view of a dry surface cleaning apparatus in accordance with the present invention.

Referring to FIG. 1, there is shown a schematic view of a dry surface cleaning apparatus in accordance with an embodiment of the present invention. The apparatus includes a laser 1 for generating a laser beam 2, a sealed chamber 11 in which a cleaning process is performed and a laser focusing lens 4 for converging the laser beam 2. The sealed chamber 11 has a transparent window 12 through which the laser beam 2 is transmitted.

The laser beam 2 generated from the laser 1 is reflected with a reflection mirror 3 and, then, proceeds into the sealed chamber 11. The laser focusing lens 4 is located near to the transparent windows 12 of the sealed chamber 11. Therefore, the laser beam 2 sequentially passes through the laser focusing lens 4 and the transparent window 12 so that the laser beam 2 may be converged on a laser focus 5 which is located around a surface of a workpiece 14 within the chamber 11. It is preferable that the laser 1 is an Nd:YAG laser or a $CO_2$ laser.

The laser beam 2 causes a plasma shock wave 6 to be generated around the laser focus 5 due to a breakdown of gas particles so that the plasma shock wave 6 may be propagated all around within the sealed chamber 11. The plasma shock wave 6 may collide with the surface of the workpiece 14. If the strength of the plasma shock wave 6 is larger than an adhesion force between the surface contaminants attached on the workpiece 14 and the workpiece 14 itself, the surface contaminants may be detached from the surface of the workpiece 14. Since the reflection mirror 3 is linearly movable to optically change the location of the laser focus 5, all surface contaminants on the whole surface of the workpiece 14 may be detached by using the plasma shock wave 6 generated around the laser focus 5.

The workpiece 14 may be fast stuck to a working table 15 by using at least one vacuum pump 25. A chamber door 13 through which the workpiece 14 may be loaded is also sealed with the vacuum generated by the vacuum pump 25. The working table 15 may be rotated in order to perform a complete cleaning of the workpiece 14. A linear motion device may be installed under the chamber 11 in order to linearly move the workpiece 14.

The transparent window 12 through which the laser beam is introduced from the outside of the chamber 11 to the inside thereof is made of, e.g., a thin plate of glasses or quartzes with a thickness of about 5 mm or smaller in order to reduce the refraction loss of the laser beam 2.

One or more gas sources 21 may be used to supply one or more gas in the sealed chamber 11. For example, an inert gas such as Ar, $N_2$, He and Ne or a reactive gas such as $O_2$, $O_3$, $NF_3$, $CF_4$, $C_2F_6$, $F_2$ and $Cl_2$ may be used as the gas sources.

If Ar gas is used, the plasma shock wave may be easily generated and also a purging effect may be generated in the chamber 11. If $O_2$ gas is used, an oxygen plasma may be generated in the chamber 11 due to the plasma shock wave so that the oxidizing power increased by oxygen radicals may cause organic surface contaminants on the surface of the workpiece 14 to be easily detached. In another embodiment, if poisonous gases such as $O_3$, $NF_3$ and so on may be used in the sealed chamber 11, $O_3$ or $NF_3$ may be ionized due to the laser induced plasma so that oxygen radicals and fluorine radicals with which the organic surface contaminants may be effectively detached may be generated. A mass flow controller 23 may be used to exactly control the input ration of such gases. If a valve 24 is controlled, such gases may be inputted through the input port 16 into the chamber 11.

The surface contaminants and the used gases generated during the cleaning process in the sealed chamber 11 are vented out through an output port 17 by the exterior vacuum pump 25.

Figure 2:
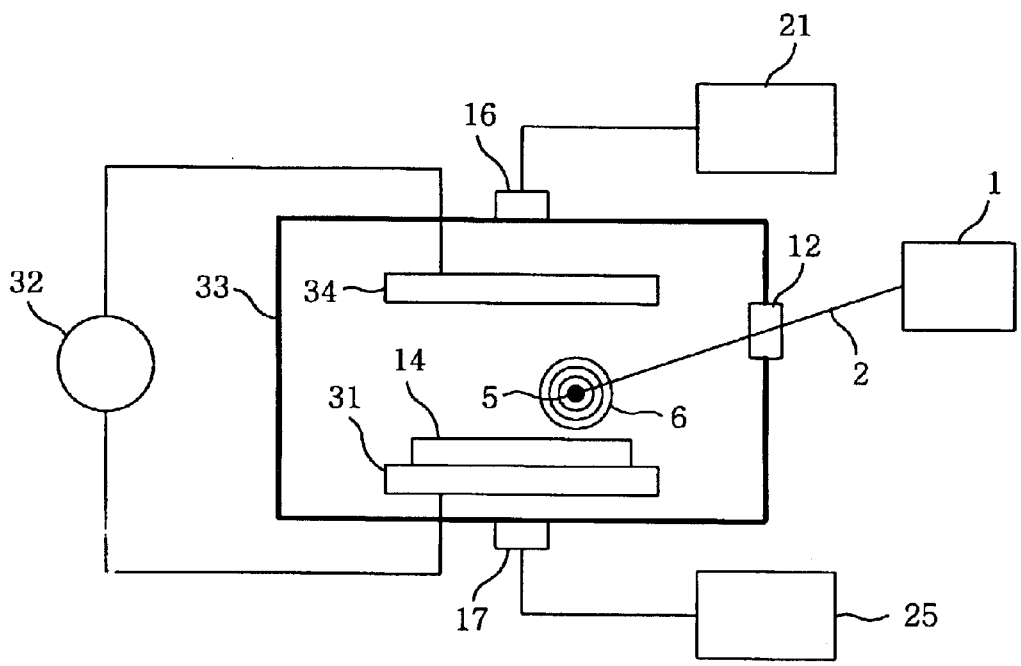
FIG. 2 shows a schematic view of another dry surface cleaning apparatus in accordance with the present invention.

Referring to FIG. 2, there is shown a schematic diagram for illustrating a second embodiment of the dry surface cleaning apparatus in accordance with the present invention, wherein the apparatus is incorporated with a vacuum deposition chamber 33. Like numerals in all embodiments represent like elements and separate descriptions may be omitted.

The conventional plasma deposition device is classified into a chemical vapor deposition and a physical vapor deposition. As shown in FIG. 2, if the gas in the gas source 21 is introduced through an input port 16 into the chamber 33 and a radio frequency (RF) power supply 32 is used to apply an RF voltage across two electrodes 31 and 34, an ionization of the gas particles results in a reactive plasma among two electrodes 31 and 34 so that the gas particles may be activated. The activated gas particles reach on the surface of the workpiece 14 to be deposited. If the RF voltage is turned off after the deposition is completed, the gas particles in the plasma randomly drop onto the surface of the workpiece 14. The particles may be attracted to a wall of the chamber during the deposition process. The particles which drop onto the surface of the workpiece are referred to as dropping particles. Since the dropping particles can cause a fatal defect in the semiconductor manufacturing process, they must be removed.

In the second embodiment of the dry surface cleaning apparatus incorporated in the vacuum deposition chamber 33 in accordance with the present embodiment, the laser 1 is installed outside of the vacuum deposition chamber 33. The vacuum deposition chamber 33 has a transparent window 12 through which the laser beam 2 may be transmitted.

The laser 1 may be used to perform a cleaning process in the vacuum deposition chamber 33. Since the laser beam 2 generated from the laser 1 is illuminated to the transparent window 12 made of glasses or quartzes, the laser beam 2 may easily be introduced from the outside of the vacuum deposition chamber 33 to the inside thereof. As shown in FIG. 2, the laser beam 2 may be converged on the laser focus 5 which is located around a surface of the workpiece 14 within the vacuum deposition chamber 33 so that the plasma shock wave 6 may be generated around the laser focus 5. Dropping particles which have remained on the workpiece 14 after the deposition process may be detached with an in-situ cleaning in the vacuum deposition chamber 33. If a metal film of Ti, Cu, Al, W, Co, Ta and so on deposited in the vacuum deposition chamber 33 is exposed in the air, the metal film is easily oxidized so that the dropping particles may be fast attached and, therefore, the dropping particles may not be easily detached with the conventional wet cleaning. The in-situ cleaning in the vacuum deposition chamber 33 in accordance with the present invention does not require the conventional cleaning so that the manufacturing cost may be smaller and the throughput may be improved.

Figure 3:
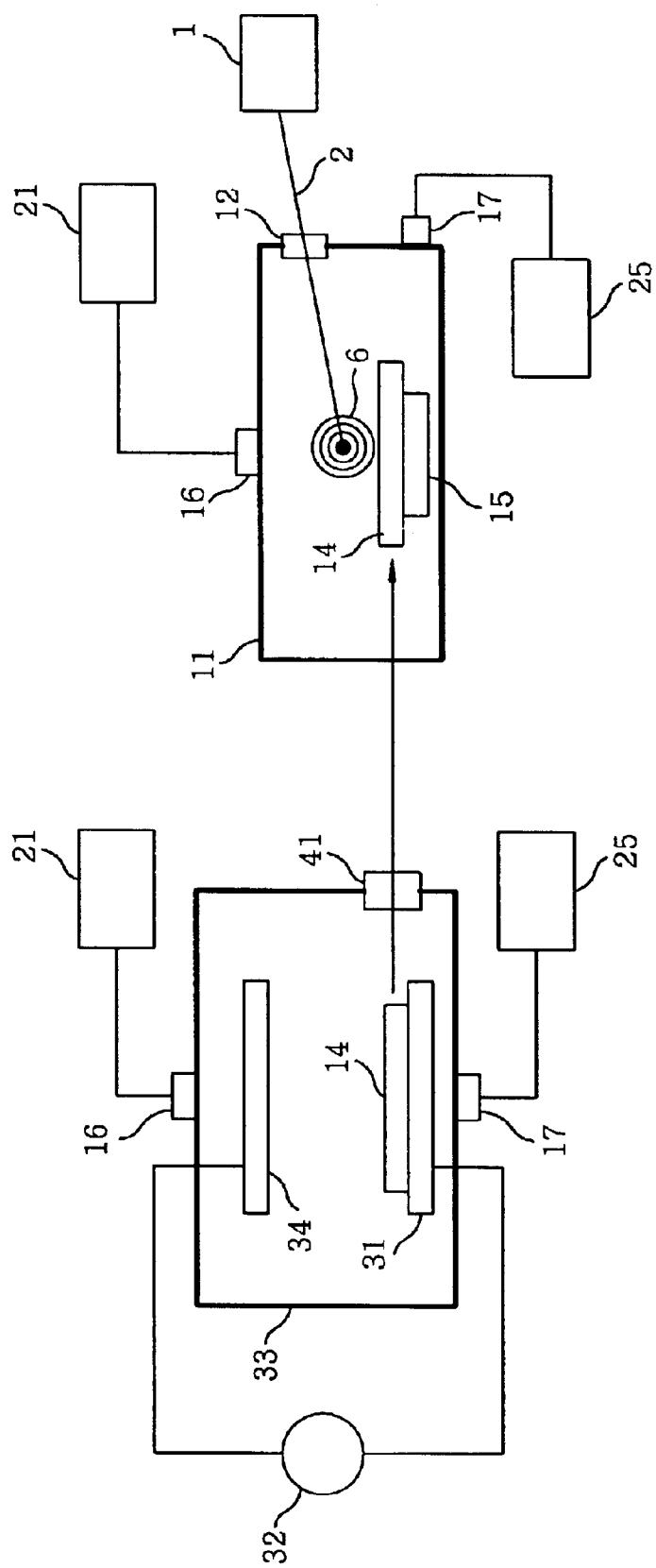
FIG. 3 presents a schematic view of still another dry surface cleaning apparatus in accordance with the present invention.

Referring to FIG. 3, there is shown a third embodiment of the dry surface cleaning apparatus in accordance with the present invention. Contrary to FIG. 2, the cleaning process may not be performed in a vacuum deposition chamber 33 but in a separate cleaning chamber 11. The workpiece 14 is surface-deposited in the vacuum deposition chamber 33 and, then, moved through a transfer port 41 into the separate cleaning chamber 11 in order that the dropping particles after the deposition process are detached from the surface of the workpiece 14. Since the vacuum deposition chamber 33 may be usually operated in a high vacuum state with the pressure of $10^{-4}$ or smaller, additional gases for performing a cleaning process must be inserted in the vacuum deposition chamber 33 in order to convert the high vacuum state to a lower vacuum state. Accordingly, after the plasma shock wave is used to perform a cleaning process, a pumping time is required to return to the high vacuum state again. In order to solve the above shortcoming, the separate cleaning chamber 11 to clean the workpiece 14 may be added without changing the high vacuum state of the deposition chamber 33. Since a multi-chamber deposition equipment has been used to perform a deposition process for manufacturing a semiconductor, the separate cleaning chamber 11 may be used to effectively clean the wafers which have been deposited through a number of deposition chambers.

As a pre-deposition cleaning chamber using inactive plasma, e.g., Ar plasma, may be added in the conventional semiconductor physical deposition equipment, the separate cleaning chamber 11 to conduct a post-deposition cleaning may be added in the equipment as shown in FIG. 3 in accordance with the present invention. In other words, after the wafer is deposited and cleaned, the wafer may be easily transmitted to another process.

While the invention has been shown and described with respect to the preferred embodiments, it will be understood by those skilled in the art that various changes and modifications may be made without departing from the spirit and scope of the invention as defined in the following claims.

What is claimed is:

1. A dry surface cleaning apparatus for removing surface contaminants on a surface of a workpiece comprising:
   a laser for generating a laser beam;
   a sealed chamber for holding the workpiece therein, wherein the sealed chamber has a transparent window through which the laser beam is transmitted;
   a reflection mirror for introducing the laser beam to the transparent window; and
   a laser focusing lens for converging the laser beam on a laser focus around the surface of the workpiece of the sealed chamber to generate a plasma shock wave due to a breakdown of gas particles around the laser focus, wherein the plasma shock wave is used to detach the surface contaminants on the surface.

2. The apparatus of claim 1, further comprising a vacuum pump for generating a vacuum state in the sealed chamber.

3. The apparatus of claim 1, wherein the reflection mirror is movable to optically change the location of the laser focus.

4. The apparatus of claim 1, wherein the transparent window is made of glass or quartz.

5. The apparatus of claim 4, wherein the transparent window has a thickness of about 5 mm or smaller.

6. The apparatus of claim 1, further comprising a gas source for feeding a gas into the sealed chamber.

7. The apparatus of claim 6, wherein the gas is an inert gas selected from a group of Ar, $N_2$, and He.

8. The apparatus of claim 6, wherein the gas is a reactive gas selected from a group of $O_2$, $O_3$, $NF_3$, $CF_4$, $C_2F_6$, $F_2$ and $Cl_2$.

9. The apparatus of claim 1, wherein the sealed chamber has:
   a set of electrodes therein to make it capable of performing an in-situ plasma deposition process; and
   an RF power supply for supplying an RF voltage between the set of electrodes.

10. The apparatus of claim 1, wherein the sealed chamber is installed as a separate cleaning chamber in a multi-chamber deposition equipment to conduct a post-deposition cleaning in the equipment.

* * * * *